United States Patent
Brebant et al.

(10) Patent No.: US 10,809,307 B2
(45) Date of Patent: Oct. 20, 2020

(54) DIFFERENTIAL BATTERY TESTERS

(71) Applicant: E-XTEQ Europe, Saint-Germain-de-la-Grange (FR)

(72) Inventors: Morgan Brebant, Gambias (FR); Frederic Platel, Maurepas (FR); Jean Yves Penouty, Mours (FR)

(73) Assignee: E-XTEQ EUROPE, Saint-Germain-Dela (FR)

( * ) Notice: Subject to any disclaimer, the term of this patent is extended or adjusted under 35 U.S.C. 154(b) by 65 days.

(21) Appl. No.: 16/136,645

(22) Filed: Sep. 20, 2018

(65) Prior Publication Data
US 2019/0094307 A1 Mar. 28, 2019

Related U.S. Application Data

(60) Provisional application No. 62/563,171, filed on Sep. 26, 2017.

(51) Int. Cl.
| | | |
|---|---|---|
| *G01R 31/385* | (2019.01) | |
| *G01R 31/389* | (2019.01) | |
| *G01R 31/392* | (2019.01) | |
| *G01R 31/3835* | (2019.01) | |
| *G01R 31/36* | (2020.01) | |

(52) U.S. Cl.
CPC ....... *G01R 31/385* (2019.01); *G01R 31/3648* (2013.01); *G01R 31/386* (2019.01); *G01R 31/389* (2019.01); *G01R 31/3835* (2019.01); *G01R 31/392* (2019.01); *G01R 31/3865* (2019.01)

(58) Field of Classification Search
CPC ................ G01R 31/385; G01R 31/389; G01R 31/3835; G01R 31/3865; G01R 31/392
See application file for complete search history.

(56) References Cited

U.S. PATENT DOCUMENTS

| | | |
|---|---|---|
| 3,315,140 A | 4/1967 | Dadin |
| 3,546,576 A | 12/1970 | Frezzolini |

(Continued)

FOREIGN PATENT DOCUMENTS

| | | |
|---|---|---|
| EP | 1115171 A1 | 7/2001 |
| EP | 1326085 A3 | 11/2007 |

(Continued)

OTHER PUBLICATIONS

Novel Field Test Equipment for Lithium-Ion Batteries in Hybrid; School of Chemical Science and Engineering, Department of Chemical Engineering and Technology; Apr. 29, 2011.

(Continued)

*Primary Examiner* — Dominic E Hawkins
(74) *Attorney, Agent, or Firm* — Young Basile Hanlon & MacFarlane, P.C.

(57) ABSTRACT

Systems and methods for battery testing are described. Some of the methods for battery testing include applying a first load impedance to a battery, applying a second load impedance to a reference voltage source, measuring a voltage between a positive terminal of the battery and a positive terminal of the reference voltage source, wherein a negative terminal of the battery is connected via a conductor to a negative terminal of the reference voltage source, and determining a condition of the battery based on the measured voltage.

20 Claims, 11 Drawing Sheets

(56) References Cited

U.S. PATENT DOCUMENTS

| | | |
|---|---|---|
| 3,855,101 A | 12/1974 | Wilson |
| 4,028,616 A | 6/1977 | Stevens |
| 4,259,686 A | 3/1981 | Suzuki et al. |
| 4,267,503 A | 5/1981 | Westra |
| 5,191,291 A | 3/1993 | Taylor |
| 5,757,192 A | 5/1998 | McShane et al. |
| 5,936,435 A | 8/1999 | Schwenkel et al. |
| 6,249,124 B1 | 6/2001 | Bertness |
| 6,310,481 B2 | 10/2001 | Bertness |
| 6,316,914 B1 | 11/2001 | Bertness |
| 6,534,993 B2 | 3/2003 | Bertness |
| 6,566,883 B1 | 5/2003 | Vonderhaar et al. |
| 7,002,265 B2 | 2/2006 | Potega |
| 7,656,162 B2 | 2/2010 | Vonderhaar et al. |
| 7,902,828 B2 | 3/2011 | Huang |
| 9,500,715 B2 | 11/2016 | Kaneko et al. |
| 9,983,266 B2 | 5/2018 | Arumugam et al. |
| 10,023,066 B2 | 7/2018 | Larsson et al. |
| 2003/0078797 A1* | 4/2003 | Kanbara ............... G06Q 30/00 705/412 |
| 2004/0108856 A1* | 6/2004 | Johnson ............... G01R 31/379 324/426 |
| 2005/0088145 A1 | 4/2005 | Loch |
| 2007/0080691 A1* | 4/2007 | Robinson, II ........ G01R 31/379 324/426 |
| 2010/0181967 A1* | 7/2010 | Huang .................. H02J 7/0071 320/158 |
| 2014/0320086 A1* | 10/2014 | Wallis .................. H02J 7/0044 320/115 |
| 2015/0025822 A1* | 1/2015 | Ladret .................. G01R 31/374 702/63 |
| 2015/0048839 A1* | 2/2015 | Desrosiers ......... G01R 19/0092 324/433 |
| 2015/0349547 A1* | 12/2015 | Jeon ..................... H02J 7/0016 320/134 |
| 2016/0245871 A1 | 8/2016 | Joe |
| 2016/0248126 A1* | 8/2016 | Wang ..................... B60L 58/16 |
| 2017/0033572 A1* | 2/2017 | Becker .................. H01M 10/48 |
| 2017/0346328 A1* | 11/2017 | Meacham, II ...... H02J 7/00718 |
| 2018/0183245 A1* | 6/2018 | Wang ..................... G01R 31/36 |

FOREIGN PATENT DOCUMENTS

| | | |
|---|---|---|
| JP | 2012163510 A | 8/2012 |
| WO | 9912044 A2 | 3/1999 |
| WO | 2002019508 A2 | 3/2002 |
| WO | 2008/002076 A1 | 1/2008 |
| WO | WO-2008002076 A1 * | 1/2008 ........... G01R 31/389 |

OTHER PUBLICATIONS

Battery testing—retrieved from https://www.mpoweruk.com/testing.htm#impedance on Jul. 17, 2018; Electropedia.

* cited by examiner

DIFFERENTIAL BATTERY TESTERS

CROSS-REFERENCE TO RELATED APPLICATIONS

This application claims the benefit of U.S. Provisional Application No. 62/563,171, filed on Sep. 26, 2017, the contents of which are hereby incorporated by reference in its entirety for all purposes.

TECHNICAL FIELD

This disclosure relates to battery testers, and more particularly to differential battery testers.

BACKGROUND

Batteries (e.g., car batteries) can be damaged or otherwise fail over time. An important diagnostic function is to be able to test the condition of the battery, which may be indicative of the battery's capacity to hold a charge and deliver current. Battery testers may measure an open circuit voltage and/or an output impedance of the battery to assess quality of the battery.

SUMMARY

Disclosed herein are implementations of differential battery testers.

One aspect of the disclosed implementations is a circuit for battery testing. The circuit includes a first connector configured to electrically couple to a positive terminal of a battery, a second connector configured to electrically couple to a negative terminal of the battery, a reference voltage source with a positive reference terminal and a negative reference terminal, a conductor connecting the second connector to the negative reference terminal, a voltmeter configured to measure voltage between a first input node and a second input node, a first switch in series with a first load impedance connected between the first connection and the second connection, a second switch in series with a second load impedance connected between the positive reference terminal and the negative reference terminal, and a processor connected to the voltmeter. The first input node is connected to the first connector and the second input node is connected to the positive reference terminal. The processor is configured to control the first switch and the second switch to selectively apply the first load impedance to the battery and the second load impedance to the reference voltage source, receive one or more measurements of voltage between the first input node and the second input node, and determine a condition of the battery based on the one or more measurements of voltage between the first input node and the second input node.

Another aspect is a method for battery testing. The method includes applying a first load impedance to a battery, applying a second load impedance to a reference voltage source, measuring a voltage between a positive terminal of the battery and a positive terminal of the reference voltage source, wherein a negative terminal of the battery is connected via a conductor to a negative terminal of the reference voltage source, and determining a condition of the battery based on the measured voltage.

Another aspect is an apparatus for battery testing. The apparatus includes a first connector configured to electrically couple to a positive terminal of a battery, a second connector configured to electrically couple to a negative terminal of the battery, a reference voltage source with a positive reference terminal and a negative reference terminal, a voltmeter configured to measure voltage between a first input node and a second input node, and a processor connected to the voltmeter. The first input node is connected to the first connector and the second input node is connected to the positive reference terminal. The processor is configured to selectively apply a first load impedance to the battery and a second load impedance to the reference voltage source, receive one or more measurements of voltage between the first input node and the second input node, and determine a condition of the battery based on the one or more measurements of voltage between the first input node and the second input node.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity. Unless otherwise noted, like reference numbers refer to like elements in the drawings.

DETAILED DESCRIPTION

Systems, circuits, and methods for battery testing are described herein. A battery under test is compared to a reference voltage source, which may be another battery (e.g., a battery known to be in good condition) or an electronic circuit designed to simulate a battery with desirable characteristics, based on differential voltage measurements. In some implementations, the reference voltage source is calibrated to match the open circuit voltage and an expected output impedance of the battery under test. Similar load impedances may be selectively applied (e.g., synchronously applied) to the battery under test and the reference voltage source to enable estimation of an output impedance and/or other conditions (e.g., a conductance, a cold crank amps, or a state of health) of the battery under test. In some implementations, if a condition of the battery under test meets a threshold, the battery passes a test. Otherwise, the battery fails. An indication of the result of the battery test may be displayed or stored.

Using differential voltage measurements for battery testing may offer advantages over conventional battery testers. For example, some of the implementations may avoid the requirement of estimating a quiescent voltage during loaded voltage measurement of the battery. Further, some of the implementations may mitigate non-linearity in a voltage measurement circuit and avoid a need for calibration to compensate for these non-linear distortions. As another example, some of the implementations may enable rapid testing of pairs of batteries against each other for manufacturing defects.

Figure 1:
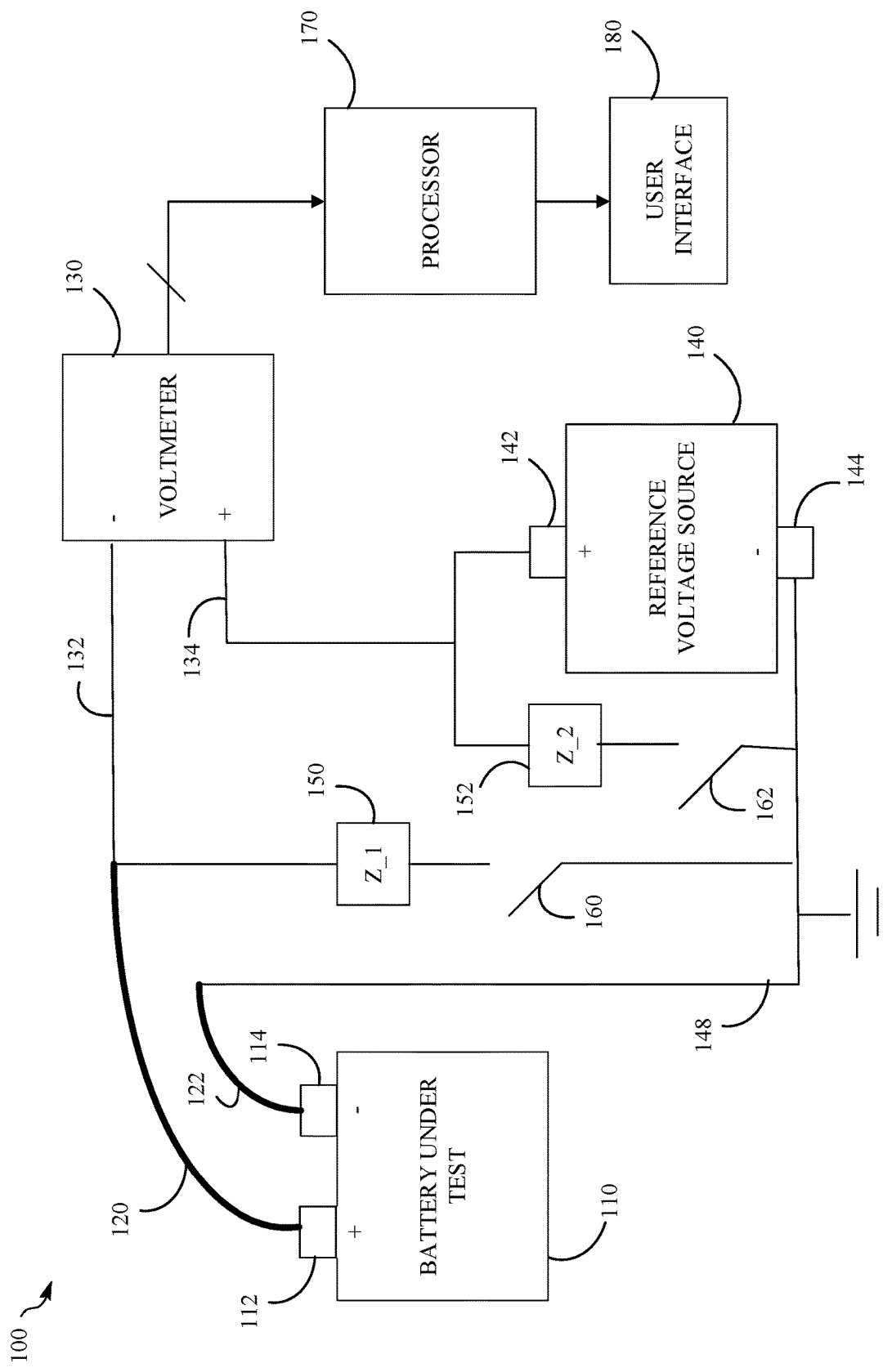
FIG. 1 is a schematic diagram of an example of a differential battery tester connected to a battery under test.

FIG. 1 is a schematic diagram of an example of a differential battery tester 100 connected to a battery under test 110. The battery under test 110 includes a positive terminal 112 and a negative terminal 114. The differential battery tester 100 includes a first connector 120 configured to electrically couple to the positive terminal 112, a second connector 122 configured to electrically couple to the negative terminal 114, a voltmeter 130 configured to measure voltage between a first input node 132 and a second input node 134, a reference voltage source 140 with a positive reference terminal 142 and a negative reference terminal 144, a conductor 148 connecting the second connector 122 to the negative reference terminal 144, a first switch 160 in series with a first load impedance 150 connected between the first connector 120 and the second connector 122, a second switch 162 in series with a second load impedance 152 connected between the positive reference terminal 142 and the negative reference terminal 144, and a processor 170 connected to the voltmeter 130. The first input node 132 is connected to the first connector 120, and the second input node 134 is connected to the positive reference terminal 142. The processor 170 is configured to control the first switch 160 and the second switch 162 to selectively apply (e.g., simultaneously apply) the first load impedance 150 to the battery under test 110 and the second load impedance 152 to the reference voltage source 140, receive one or more measurements of voltage between the first input node 132 and the second input node 134, and determine a condition of the battery under test 110 based on the one or more measurements of voltage between the first input node 132 and the second input node 134. For example, the differential battery tester 100 may be used to implement the process 700 of FIG. 7.

The battery under test 110 may include one or more electrochemical cells with a positive terminal 112 and a negative terminal 114. The battery under test 110 may be rechargeable. Various chemistries may be used in the battery under test 110. For example, the battery under test 110 may be a lead-acid battery or a lithium ion battery. In some implementations (not shown in FIG. 1), the battery under test 110 may also be connected to a load circuit (e.g., a vehicle electrical system). For example, the battery under test 110 may be a car battery.

The differential battery tester 100 includes a first connector 120 configured to electrically couple to a positive terminal of a battery and a second connector 122 configured to electrically couple to a negative terminal of the battery. In an example, the first connector 120 includes an alligator clip that may be clipped to the positive terminal 112 of the battery under test 110. Similarly, the second connector 122 may include an alligator clip that may be clipped to the negative terminal 114 of the battery under test 110. In some implementations, the first connector 120 and the second connector 122 form a four terminal Kelvin connection with the battery under test 110. The first connector 120 may include a pair of conductive wires in a cable and the second connector 122 may include a pair of conductive wires in a cable.

The differential battery tester 100 includes a reference voltage source 140 with a positive reference terminal 142 and a negative reference terminal 144. For example, the reference voltage source 140 may include circuitry configured to simulate a battery in a good condition. In some implementations, electrical characteristics of the reference voltage source 140 may be adjusted or calibrated by the processor 170. The reference voltage source 140 source may be implemented as the reference voltage source 200 of FIG. 2. The reference voltage source 140 source may be implemented as the reference voltage source 300 of FIG. 3. In some implementations, the reference voltage source 140 includes a battery (e.g., one or more electrochemical cells) that may serve as a reference for comparison with the performance of the battery under test 110. In this example, the reference voltage source 140 source may be implemented as the reference voltage source 400 of FIG. 4.

The differential battery tester 100 includes a conductor 148 connecting the second connector 122 to the negative reference terminal 144. For example, the conductor 148 may include a wire, a conductive plate, and/or a backplane. The conductor 148 may be connected to ground.

The differential battery tester 100 includes a voltmeter 130 configured to measure voltage between a first input node 132 and a second input node 134. The first input node 132 is connected to the first connector 120 and wherein the second input node 134 is connected to the positive reference terminal 142. The voltmeter 130 may include the voltmeter 500 of FIG. 5.

The differential battery tester 100 includes a first switch 160 in series with a first load impedance 150 connected between the first connector 120 and the second connector 122. By controlling the first switch 160, the first load impedance 150 may be selectively applied to the battery under test 110 via the first connector 120 and the second connector 122. For example, the first load impedance 150 can be or include a resistor (e.g., 10 Ohms, 100 Ohms, 1 Ohms, or 12 kOhms). The first switch 160 may be a metal oxide semiconductor field effect transistor (MOSFET).

The differential battery tester 100 includes a second switch 162 in series with a second load impedance 152 connected between the positive reference terminal 142 and the negative reference terminal 144. By controlling the second switch 162, the second load impedance 152 may be selectively applied to the reference voltage source 140. For example the second load impedance 152 can be or include a resistor (e.g., 10 Ohms, 100 Ohms, 1 kOhms, or 12 kOhms). The second switch 162 may be a metal oxide semiconductor field effect transistor (MOSFET). The first load impedance 150 and the second load impedance 152 may have matching impedance values to enable applying similar load conditions to the battery under test 110 and the reference voltage source 140 to facilitate comparison of the battery under test 110 to the reference voltage source 140. In some implementations, the first switch 160 and the second switch 162 are controlled synchronously by the processor 170 (e.g., by applying the same voltage to a gate terminal of the first switch 160 and a gate terminal of the second switch 162) in order to simultaneously disconnect or apply load impedance to both the battery under test 110 and the reference voltage source 140.

The differential battery tester 100 includes a processor 170 connected to the voltmeter 130. The processor 170 may include one or more components or devices capable of manipulating or processing data. The processor 170 may include single or multiple processors, each having single or multiple processing cores. For example, the processor 170 may include a microcontroller or a microprocessor. In some implementations, the processor 170 is implemented on the same circuit board with the voltmeter 130. The processor may include an analog to digital converter port for receiving analog voltage measurements from the voltmeter 130. In some implementations, the processor 170 is implemented on a different circuit board from the voltmeter 130, but within a common device housing. For example, the processor may receive voltage measurements in digital form over a bus or serial port (e.g., using an I2C or Serial Peripheral Interface protocol). In some implementations, the processor 170 is implemented in a device that is separable from a device containing the voltmeter 130, and the processor 170 receives voltage measurements from the voltmeter via communication signals (e.g., wired or wireless network communication signals, such as Bluetooth or WiFi signals).

The processor 170 may be configured to control the first switch 160 and the second switch 162 to selectively apply the first load impedance 150 to the battery under test 110 and the second load impedance 152 to the reference voltage source 140. For example, the processor 170 may be configured to simultaneously apply the first load impedance 150 to the battery under test 110 and the second load impedance 152 to the reference voltage source 140. The processor 170 may be configured to receive one or more measurements of voltage between the first input node 132 and the second input node 134. The processor 170 may be configured to determine a condition (e.g., an output impedance, an output conductance, a state of charge, and/or a state of health) of the battery under test 110 based on the one or more measurements of voltage between the first input node 132 and the second input node 134. In some implementations, the processor 170 is configured to calibrate the reference voltage source 140 (e.g., by adjusting an output impedance and/or an open circuit voltage of the reference voltage source 140) to facilitate testing of the battery under test 110 based on measurements of the difference in voltage between the battery under test 110 the reference voltage source 140. The processor 170 may be configured to implement the process 700 of FIG. 7, the process 1000 of FIG. 10, the process 1100 of FIG. 11, or any combination thereof.

The differential battery tester 100 includes a user interface 180. For example, the user interface 180 may include a touchscreen display for presenting results (e.g., an output impedance estimate, a state of health, and/or an indication of passing or failing) of a test of the battery under test 110. The user interface 180 may include buttons or switches enabling a person to manually turn the differential battery tester 100 on and off, adjust test settings, etc. In some implementations, the user interface 180 includes a liquid crystal display (LCD) or cathode ray tube (CRT) monitor for presenting results of a test of the battery under test 110. The user interface 180 may include a keyboard, mouse, trackpad, and/or microphone for receiving user input.

In some implementations, the differential battery tester 100 includes circuitry in the interface to the battery under test 110 to provide reverse polarity protection to prevent damage in the event the first connector 120 and the second connector 122 are coupled to the wrong terminals of the battery under test 110.

In some implementations, the differential battery tester 100 includes circuitry that connects the first input node 132 to the positive terminal 112 of the battery under test 110 and amplifies the voltage at the positive terminal 112 by a constant gain. For example, the gain of this circuitry may be less than one to step down the voltage of the battery to a lower level for comparison with a reference voltage source 140 that is configured to operate at a lower voltage level (e.g., step down to a range less than 3.3 Volts) to match the voltage readily available in an electronic device including the processor 170. This amplifier circuitry that connects the positive terminal 112 to the first input node 132 may include an operational amplifier.

Figure 2:
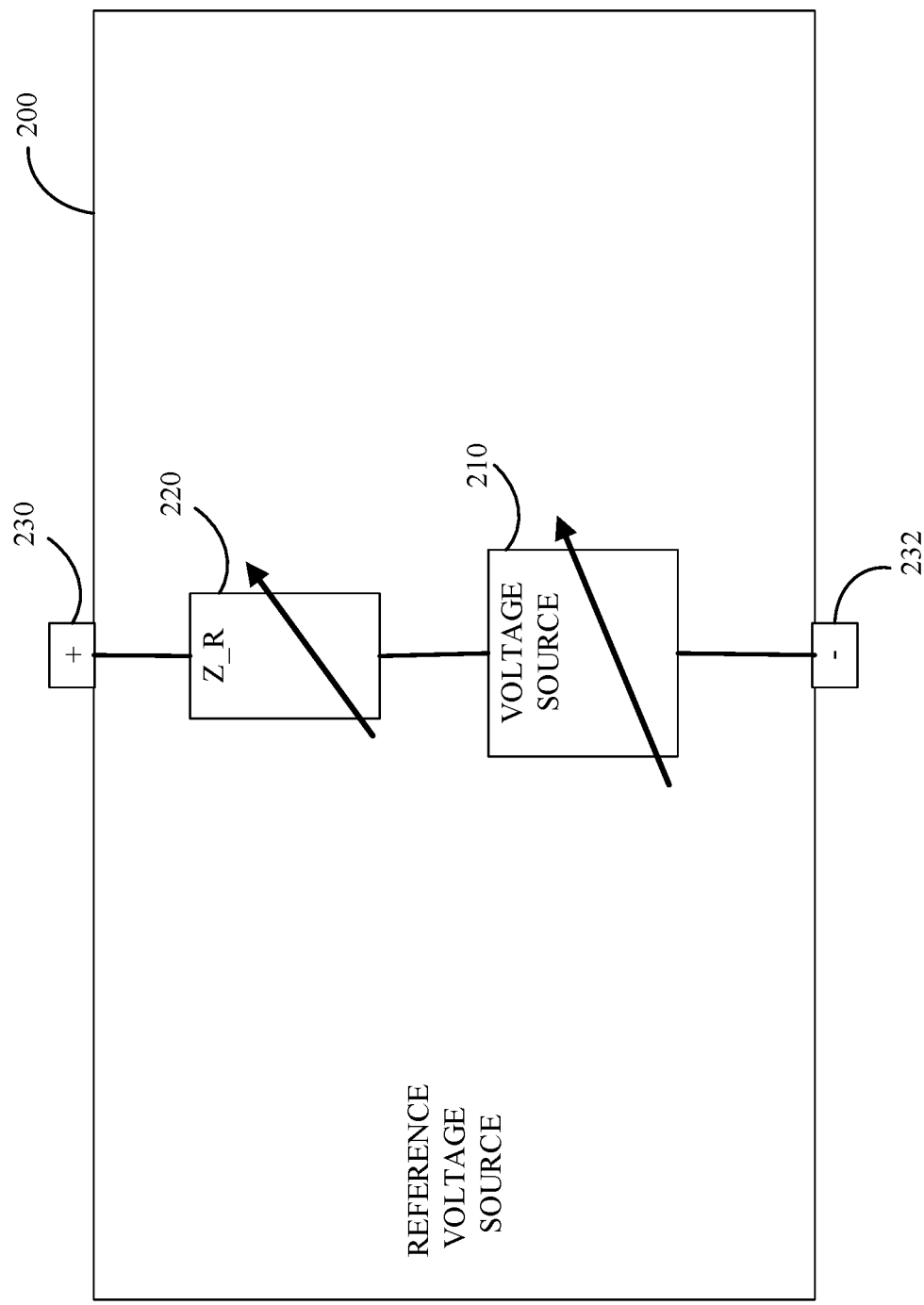
FIG. 2 is a schematic diagram of an example of a reference voltage source.

FIG. 2 is a schematic diagram of an example of a reference voltage source 200. The reference voltage source 200 includes an adjustable voltage source 210 configured to output a voltage level selected by a processor (e.g., the processor 170), an adjustable impedance 220 configured to be selected based on control signals from the processor, a positive reference terminal 230, and a negative reference terminal 232. For example, the circuitry of FIG. 3 may be used to provide the adjustable voltage source 210 and the adjustable impedance 220. The process 800 of FIG. 8 may be implemented to adjust the output impedance and/or the voltage level of the reference voltage source 200.

The reference voltage source 200 includes the adjustable voltage source 210. For example, the adjustable voltage source 210 may be controlled by a pulse width modulated control signal from a processor (e.g., the processor 170) to select a voltage level. In some implementations, the adjustable voltage source 210 is adjusted to match the open circuit voltage of the reference voltage source 200 to an open circuit voltage of a battery under test (e.g., the battery under test 110).

The reference voltage source 200 includes the adjustable impedance 220. For example, the adjustable impedance 220 may include a variable resistance (e.g., a potentiometer). An output impedance of the reference voltage source 200 may be adjusted. For example, the adjustable impedance 220 may be adjusted to a known value that is close to an expected output impedance of a battery under test (e.g., the battery under test 110).

Figure 3:
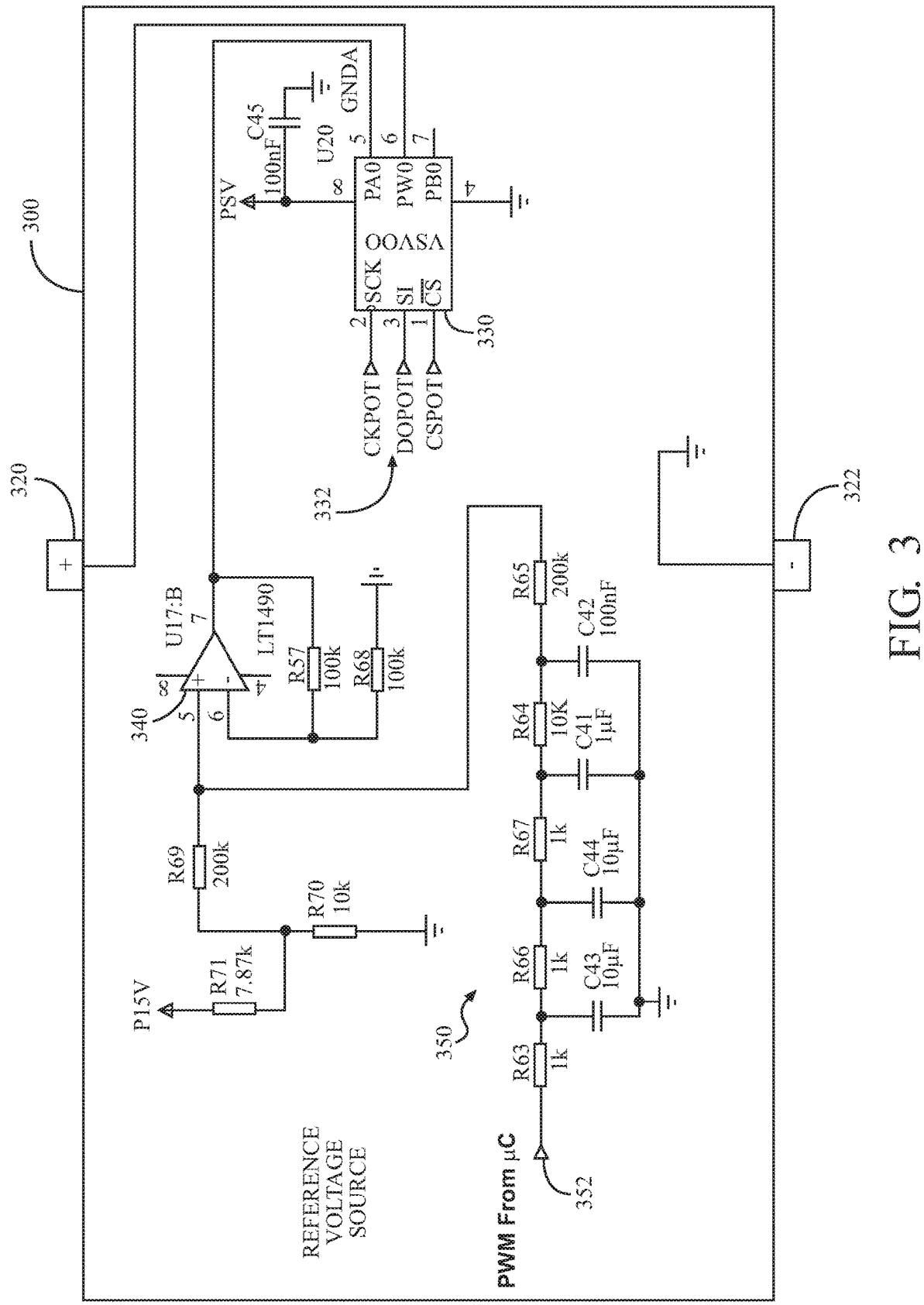
FIG. 3 is a schematic diagram of an example of a reference voltage source.

FIG. 3 is a schematic diagram of an example of a reference voltage source 300. The reference voltage source 300 includes a positive reference terminal 320, a negative reference terminal 322, a potentiometer 330 with an impedance that may be selected using a control signal on a impedance control port 332, an operational amplifier 340, and a resistor-capacitor network 350 configured to low-pass filter a pulse width modulated (PWM) voltage control signal appearing at voltage control port 352. The PWM voltage control signal may be used to set a voltage level for the reference voltage source 300. The operational amplifier 340 may operate in a linear (non-saturated) mode. For example, the PWM voltage control signal input at the voltage control port 352 may alternate between a pull-down (low voltage or ground) state and a high voltage or high impedance state in a square wave pattern with a duty cycle selected to control a voltage level for the reference voltage source 300. In some implementations, a 0% duty cycle (constant low or ground state) corresponds to a minimum available output voltage (e.g., approximately 9 Volts or 10 Volts) and a 100% duty cycle (constant high state) corresponds to a maximum available output voltage (e.g., 15 Volts or 16 Volts) of the reference voltage source 300. The resistor-capacitor network 350 may be configured to filter the PWM voltage control signal from the processor 170 to control an output voltage of an adjustable voltage source (e.g., the adjustable voltage source 210).

Figure 4:
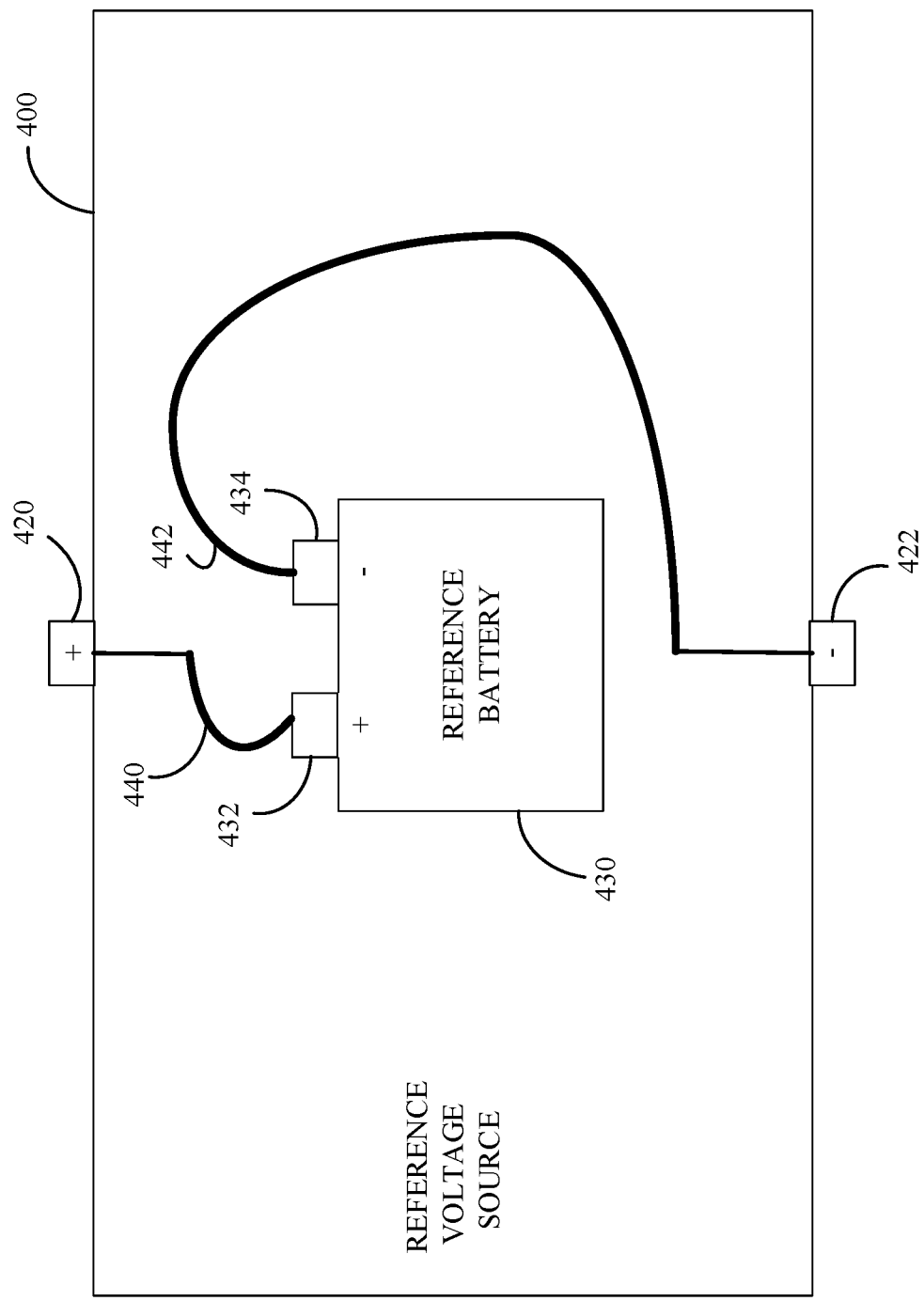
FIG. 4 is a schematic diagram of an example of a reference voltage source.

FIG. 4 is a schematic diagram of an example of a reference voltage source 400. The reference voltage source 400 includes a positive reference terminal 420, a negative reference terminal 422, a reference battery 430 with a positive terminal 432 and a negative terminal 434, a third connector 440 that connects the positive terminal 432 of the reference battery 430 to the positive reference terminal 420 of the reference voltage source 400, and a fourth connector 442 that connects the negative terminal 434 of the reference battery 430 to the negative reference terminal 422 of the reference voltage source 400. The reference battery 430 may have electrical characteristics that are considered useful or desirable.

As shown, the third connector 440 is connected to the positive reference terminal 420, and is configured to electrically couple to a positive terminal 432 of the reference battery 430. Similarly, the fourth connector 442 is connected to the negative reference terminal 422, and is configured to electrically couple to a negative terminal 434 of a reference battery 430. In some implementations, the third connector 440 and the fourth connector 442 respectively include an alligator clip and a cable including a wire.

Figure 5:
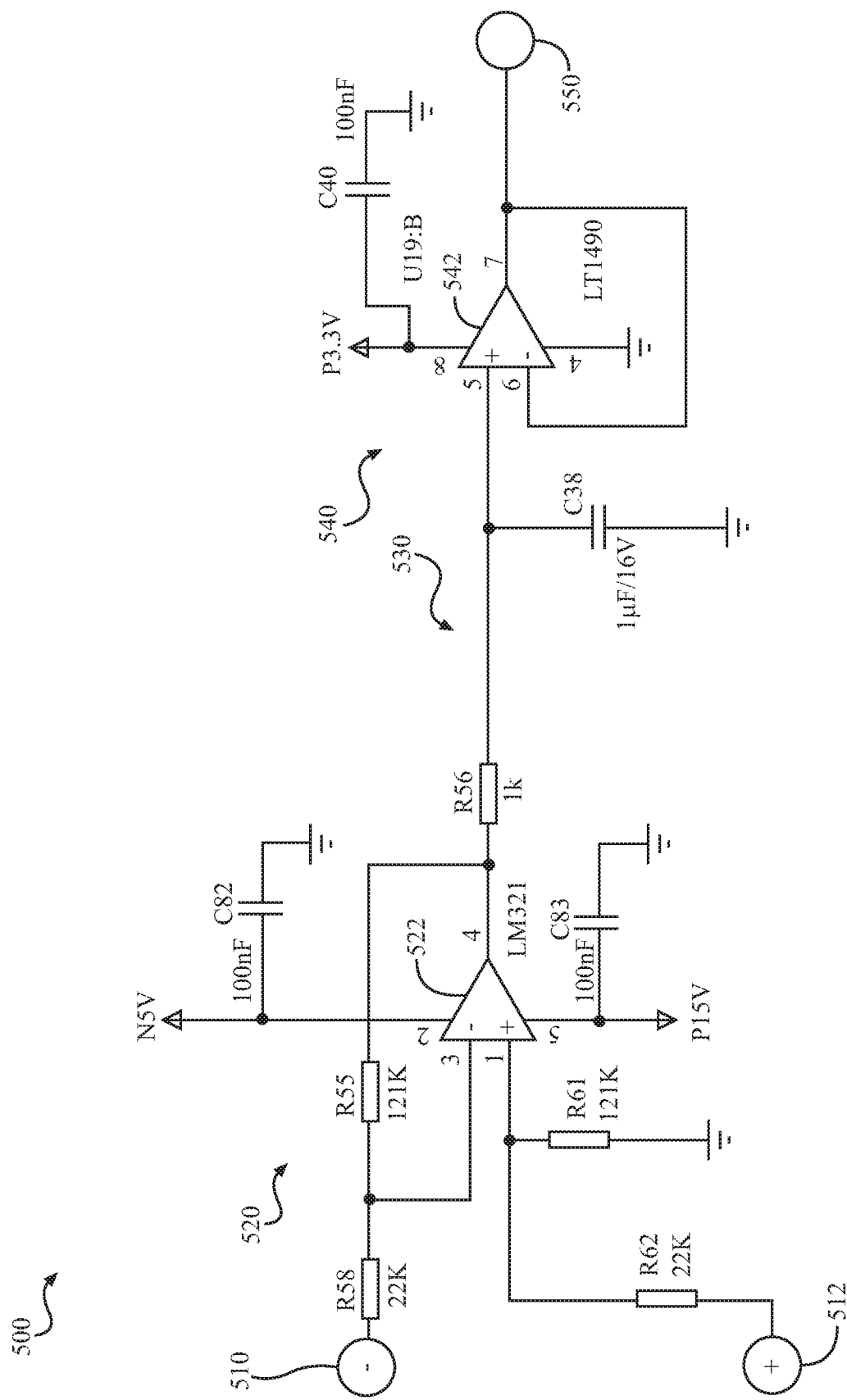
FIG. 5 is a schematic diagram of an example of a voltmeter.

FIG. 5 is a schematic diagram of an example of a voltmeter 500. The voltmeter 500 as shown includes a first input node 510, a second input node 512, a differential amplifier circuit 520, which includes an operational amplifier 522, for amplifying the voltage between the first input node 510 and the second input node 512, a resistor-capacitor (RC) low-pass filter 530 for low-pass filtering output voltages from the differential amplifier circuit 520, a buffer 540, including an operational amplifier 542, for conditioning the resulting voltage measurements from the RC low-pass filter 530 for input to a processor (e.g., the processor 170), and an output node 550 that can present differential voltage measurements to the processor.

The voltmeter 500 may be used to measure a differential voltage between a battery under test (e.g., the battery under test 110) and a reference voltage source (e.g., the reference voltage source 140). For example, the first input node 510 of the voltmeter 500 may be connected to the first input node 132 of FIG. 1 and the second input node 512 of the of the voltmeter 500 may be connected to the second input node 134 of FIG. 1. The output node 550 may be connected to a processor (e.g., the processor 170) via an analog-to-digital converter that samples the differential voltage measurements appearing at the output node 550.

The operational amplifier 522 is configured to amplify voltage between the first input node 510 and the second input node 512. In this example of a voltmeter 500, the gain of the differential amplifier circuit 520 is approximately $5.5*(V\_ref - V\_bat)$, where $V\_bat$ is the voltage at the first input node 510 and $V\_ref$ is the voltage at the second input node 512. This gain of differential amplifier circuit 520 is approximately equal to the gain of the voltmeter 500 for low frequency (e.g., direct current (DC)) input voltages.

In some implementations (not shown), the first input node 510 is connected to the differential amplifier circuit 520 by a buffer with unit gain (e.g., an operational amplifier in a negative feedback, voltage follower configuration) in order to increase the input impedance of voltmeter 500. In some implementations (not shown), the second input node 512 is connected to the differential amplifier circuit 520 by a buffer with unit gain (e.g., an operational amplifier in a negative feedback, voltage follower configuration) in order to increase the input impedance of voltmeter 500.

Figure 6:
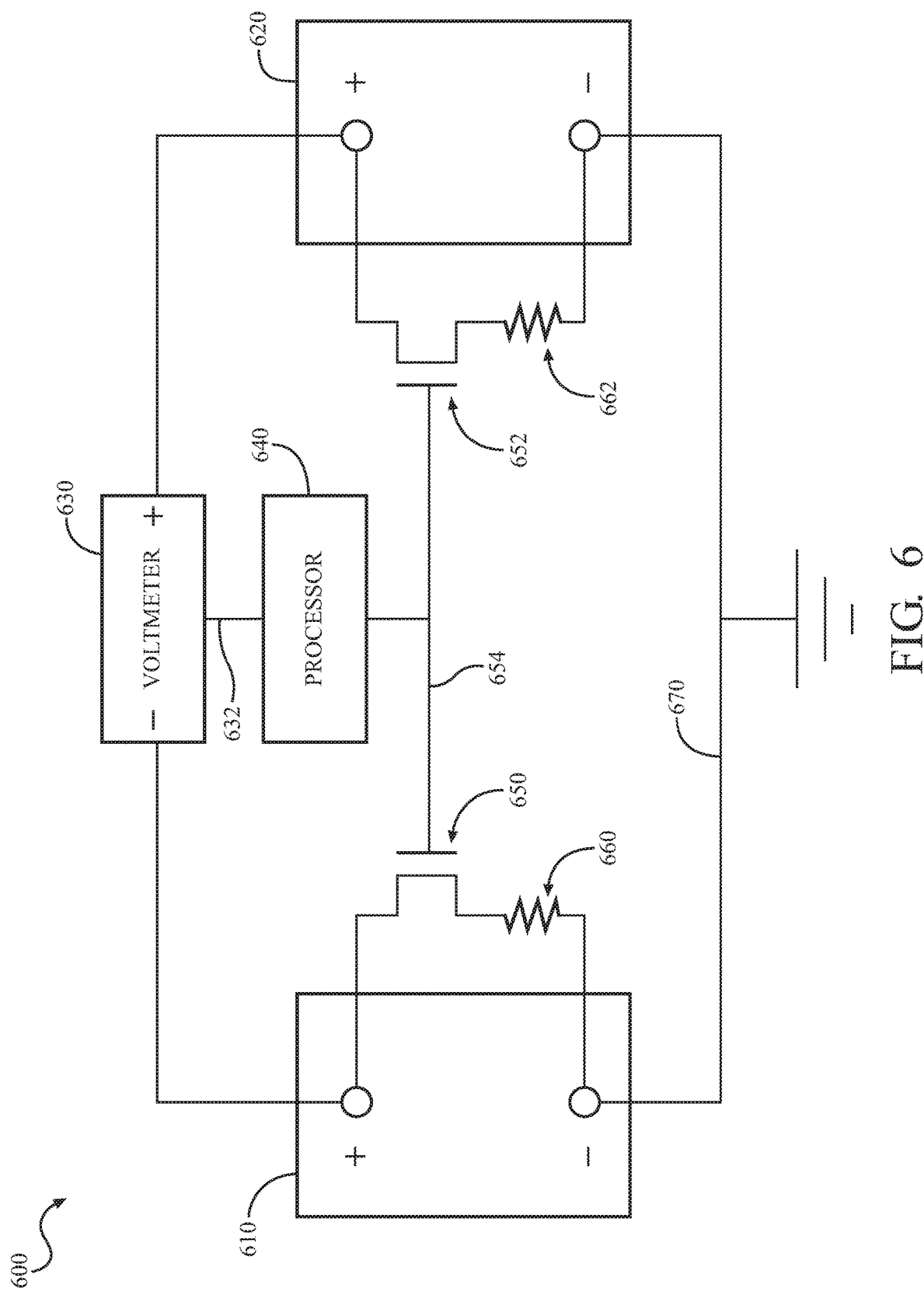
FIG. 6 is a schematic diagram of an example of a differential battery tester connected to two batteries.

FIG. 6 is a schematic diagram of an example of a differential battery tester 600 connected to two batteries. The differential battery tester 600 may be used to compare a condition (e.g., an output impedance, a state of charge, and/or a state of health) of two batteries to detect differences in the condition of the two batteries. Detecting differences in the condition of the two batteries may provide an indication that one of the batteries is defective. For example, where one of the batteries is known to be in good condition, a difference in condition exceeding a threshold may indicate the other battery is defective and a small difference in condition may indicate the other battery is in good condition. For example, where the condition of both batteries is unknown but it is assumed that defects are rare, a difference in condition exceeding a threshold may indicate the one of the batteries is defective and a small difference in condition may indicate the both batteries are in good condition. The differential battery tester 600 may be used to test pairs of newly manufactured batteries in a factory.

The differential battery tester 600 is connected to a first battery 610 and to a second battery 620. The differential battery tester 600 includes a voltmeter 630 that outputs voltage measurements 632 of the voltage difference between positive terminals of the first battery 610 and the second battery 620 to a processor 640. The differential battery tester 600 includes a first switch 650 (e.g., a MOSFET) in series with a first load impedance 660 (e.g., a resistor) connected between the positive and negative terminals of the first battery 610. The differential battery tester 600 includes a second switch 652 (e.g., a MOSFET) in series with a second load impedance 662 (e.g., a resistor) connected between the positive and negative terminals of the second battery 620. The gate terminals of the first switch 650 and the second switch 652 are connected to control line 654 that is driven by the processor 640 to synchronously control when first load impedance 660 and the second load impedance will be applied to the first battery 610 and the second battery 620 respectively. The differential battery tester 600 includes a conductor 670 that connects negative terminals of the first battery 610 and the second battery 620.

The processor 640 may be configured to open the first switch 650 and the second switch 652 while using the voltmeter 630 to measure a voltage difference between the open circuit voltage of the first battery 610 and the open circuit voltage of the second battery 620. The processor 640 may be configured to close the first switch 650 and the second switch 652 while using the voltmeter 630 to measure a voltage difference between the loaded voltage of the first battery 610 and the loaded voltage of the second battery 620. In some implementations, the first load impedance 660 and the second load impedance 662 have approximately equal impedance values to facilitate comparison of a condition of the first battery 610 and the second battery 620.

Figure 7:
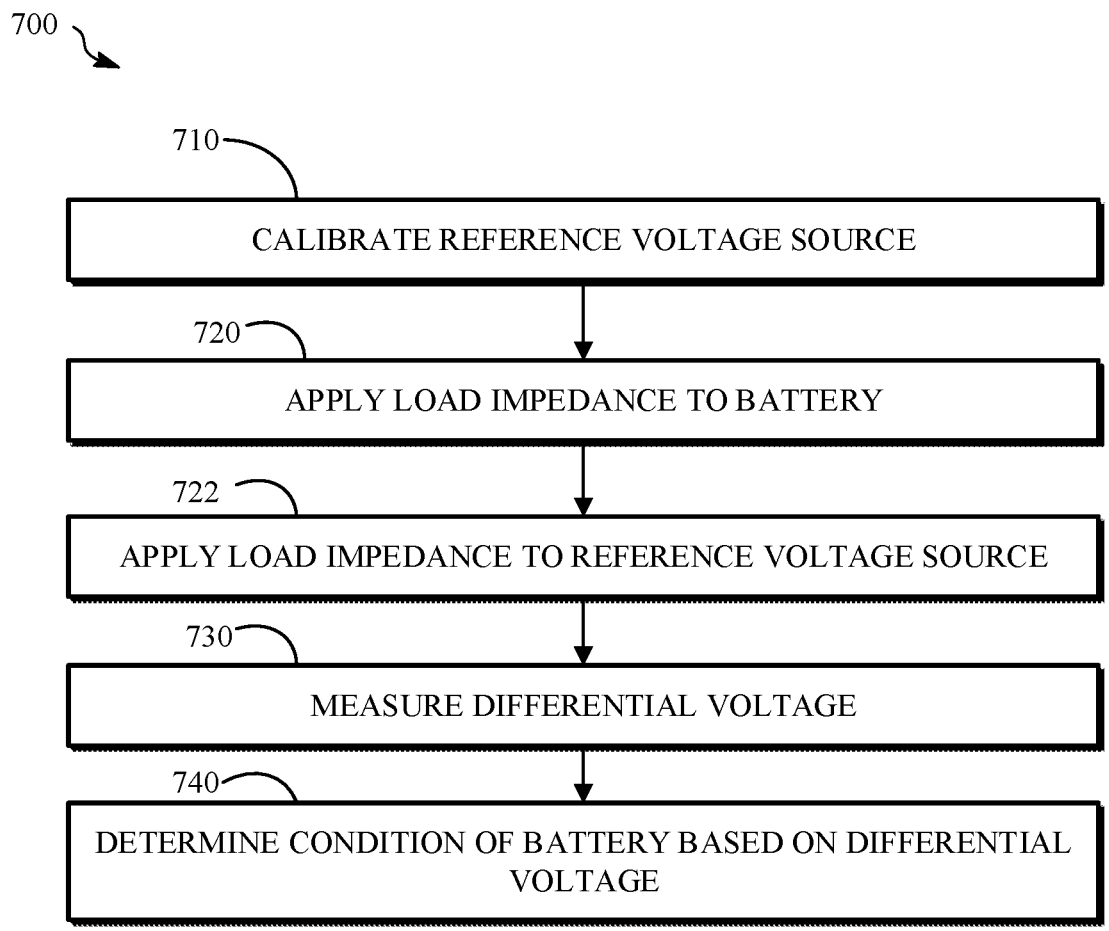
FIG. 7 is a flowchart of an example of a process for testing a battery using a differential battery tester.

FIG. 7 is a flowchart of an example of a process 700 for testing a battery using a differential battery tester. The process 700 includes calibrating 710 a reference voltage source; applying 720 a first load impedance to a battery; applying 722 a second load impedance to a reference voltage source; measuring 730 a voltage between a positive terminal of the battery and a positive terminal of the reference voltage source; and determining 740 a condition of the battery based on the measured voltage. For example, the process 700 may be implemented using the differential battery tester 100 of FIG. 1.

The process 700 includes calibrating 710 a reference voltage source (e.g., the reference voltage source 140 of FIG. 1). The reference voltage source may be calibrated 710 based on an open circuit differential voltage (i.e., a difference in voltage between a battery under test and the reference voltage source while no load impedance is applied to the battery and no load impedance is applied to the reference voltage source). For example, in the differential battery tester 100, the reference voltage source 140 may be calibrated 710 based on an open circuit voltage between the positive terminal of the battery (e.g., the battery under test 110) and the positive reference terminal 142 of the reference voltage source 140 that is measured while a current through the first load impedance 150 is zero and a current through the second load impedance 152 is zero. During calibration 710, the voltage of the reference voltage source may be adjusted (e.g., using a pulse width modulated control signal input through the voltage control port 352 of FIG. 3) to match the open circuit voltage of a battery under test. In some implementations, the voltage of the reference voltage source is iteratively adjusted until the measured differential voltage is at or near zero so that the open circuit voltage of the reference voltage source is configured to match the open circuit voltage of a battery under test. In this case, the open circuit voltage of battery under test may be determined to be equal to the configured voltage of the reference voltage source offset by any residual measured differential voltage. Calibrating 710 the reference voltage source may also include setting an output impedance of the reference voltage source to known value (e.g., an impedance value that is expected to be close to the output impedance for a battery under test that is in good condition). The reference voltage source may be calibrated 710 by implementing the process 800 of FIG. 8.

The process 700 includes applying 720 a first load impedance to a battery. For example, in the differential battery tester 100, the first load impedance 150 may be applied 720 to the battery under test 110 by closing the first switch 160, causing current from the battery under test 110 to flow through the first load impedance 150. Applying 720 the first load impedance to the battery may include closing a first switch connected in series with the first load impedance between the positive terminal of the battery and the negative terminal of the battery.

The process 700 includes applying 722 a second load impedance to a reference voltage source. Applying 722 the second load impedance to the reference voltage source may include closing a second switch connected in series with the first load impedance between the positive terminal of the reference voltage source and the negative terminal of the reference voltage source. In some implementations, the first switch and the second switch are controlled by a common control signal. For example, in the differential battery tester 100, the second load impedance 152 is applied 722 to the reference voltage source 140 by closing the second switch 162, causing current from the reference voltage source 140 to flow through the second load impedance 152. The second load impedance may have the same impedance value as the first load impedance. The first load impedance and the second load impedance may be synchronously applied (e.g., simultaneously applied). For example, switches used to apply 720 the first load and to apply 722 the second load may be closed synchronously by issuing a control signal to a common gate node for the switches (e.g., the control line 654 of FIG. 6).

The process 700 includes measuring 730 a voltage between a positive terminal of the battery and a positive terminal of the reference voltage source. A negative terminal of the battery may be connected via a conductor to a negative terminal of the reference voltage source. For example, in the differential battery tester 100, the voltmeter 130 is used to measure 730 the voltage between the positive terminal 112 of the battery under test 110 and the positive reference terminal 142 of the reference voltage source 140. The voltage measured 730 may be measured while the first load impedance and the second load impedance are applied to the battery under test 110 and the reference voltage source 140 respectively.

The process 700 includes determining 740 a condition (e.g., an output impedance, an inductance, and/or a state of health) of the battery based on the measured voltage. For example, an output impedance of the battery under test 110 may be determined 740 based on the differential voltage measured 730, the open circuit voltage of the battery under test 110, the calibrated 710 open circuit voltage of the reference voltage source, the calibrated 710 output impedance of the reference voltage source, the known impedance of the first load impedance, and the known impedance of the second load impedance. In some implementations, determining 740 the condition of the battery based on the measured voltage may include determining an output impedance of the battery by dividing the measured voltage by an estimate of current through the first impedance and adding an output impedance of the reference voltage source. For example, assuming the first load impedance and the second load impedance are equal and much larger than the output impedance of the battery and the output impedance of the reference voltage source, and that the open circuit voltage of the reference voltage source is equal to the open circuit voltage of the battery (e.g., due to calibration), then the current through the battery and the current through the reference voltage source are both approximated as $I=V\_bat/Z\_1=V\_ref/Z\_2$, where V_bat is the open circuit voltage of the battery, Z_1 is the first load impedance, V_ref is the open circuit voltage of the reference voltage source, and Z_2 is the second load impedance. In this case, the output impedance of the battery may be determined 740 as $R\_bat=(V\_diff/I)+R\_ref$, where V_diff is the measured voltage and R_ref is the calibrated 710 output impedance of the reference voltage source. In some implementations, a state of health of the battery may be determined 740 based on the output impedance of the battery. For example, the process 900 of FIG. 9A may be implemented to determine 740 a condition of the battery. The condition of the battery may be determined 740 by the processor 170 of FIG. 1.

Figure 8:
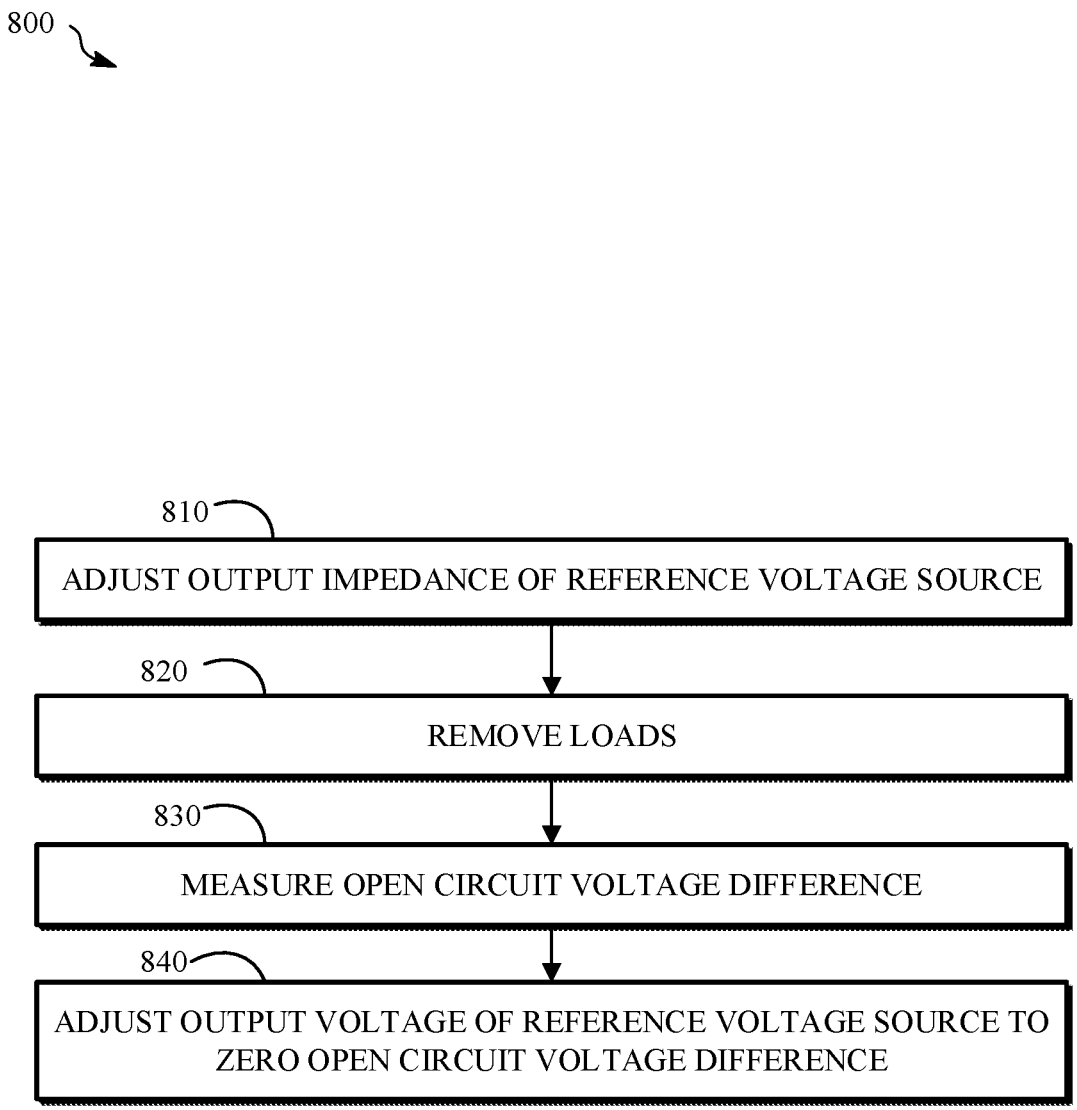
FIG. 8 is a flowchart of an example of a process for calibrating a reference voltage source.

FIG. 8 is a flowchart of an example of a process 800 for calibrating a reference voltage source. The process 800 includes adjusting 810 the output impedance of a reference voltage source, removing 820 load impedances from a battery and the reference voltage source, measuring 830 an open circuit voltage difference between the battery and the reference voltage source, and adjusting 840 the output voltage of the reference voltage source to zero the open circuit voltage difference. The process 800 may be implemented by the differential battery tester 100 of FIG. 1.

The process 800 includes adjusting 810 the output impedance of a reference voltage source. For example, the output impedance of the reference voltage source may be adjusted 810 to take an expected impedance value for the output impedance of a battery under test.

The process 800 includes removing 820 load impedances from a battery and the reference voltage source. For example, in the differential battery tester 100, the first load impedance 150 is removed 820 by opening the first switch 160 and the second load impedance 152 is removed 820 by opening the second switch 162.

The process 800 includes measuring 830 an open circuit voltage difference between the battery and the reference voltage source. For example, in the differential battery tester 100, the open circuit voltage difference is the voltage measured 830 between the first input node 132 and the second input node 134 while first switch 160 and the second switch 162 are open.

The process 800 includes adjusting 840 the output voltage of the reference voltage source to zero the open circuit voltage difference. For example, calibrating the reference voltage source may include adjusting 840 an output voltage of the reference voltage source until the open circuit voltage difference becomes zero.

Figure 9A:
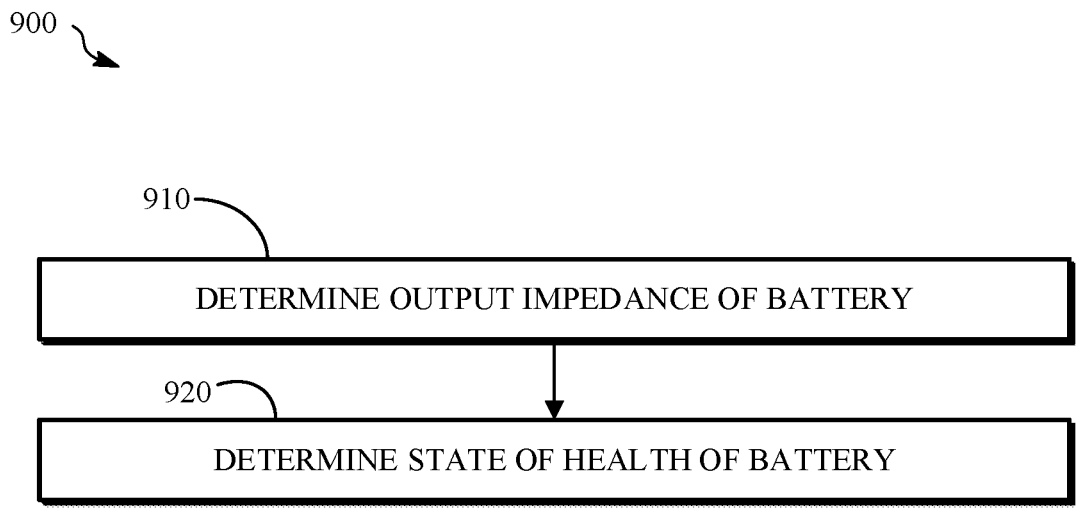
FIG. 9A is a flowchart of an example of a process for determining a condition of a battery.

FIG. 9A is a flowchart of an example of a process 900 for determining a condition of a battery (e.g., the battery under test 110) based on a measured voltage (e.g., the voltage between the first input node 132 and the second input node 134 in FIG. 1). The process 900 includes determining 910 an output impedance of a battery and determining 920 a state of health of the battery. The process 900 may be implemented by the differential battery tester 100 of FIG. 1.

The process 900 includes determining 910 an output impedance of a battery based on the measured voltage and an output impedance of the reference voltage source. For example, the output impedance of the battery may be determined 910 as R_bat=(Z_2*V_diff/V_ref)+R_ref, where V_diff is the measured voltage, V_ref is a calibrated open circuit voltage of the reference voltage source, Z_2 is a second load impedance that is applied to the reference voltage source, and R_ref is the calibrated output impedance of the reference voltage source.

The process 900 includes determining 920 a state of health of the battery based on the output impedance of the battery. For example, the state of health (SOH) may be determined 920 as SOH=100*R_good/R_bat, where R_good is an expected or good output impedance value for the battery that is known a priori.

Figure 9B:
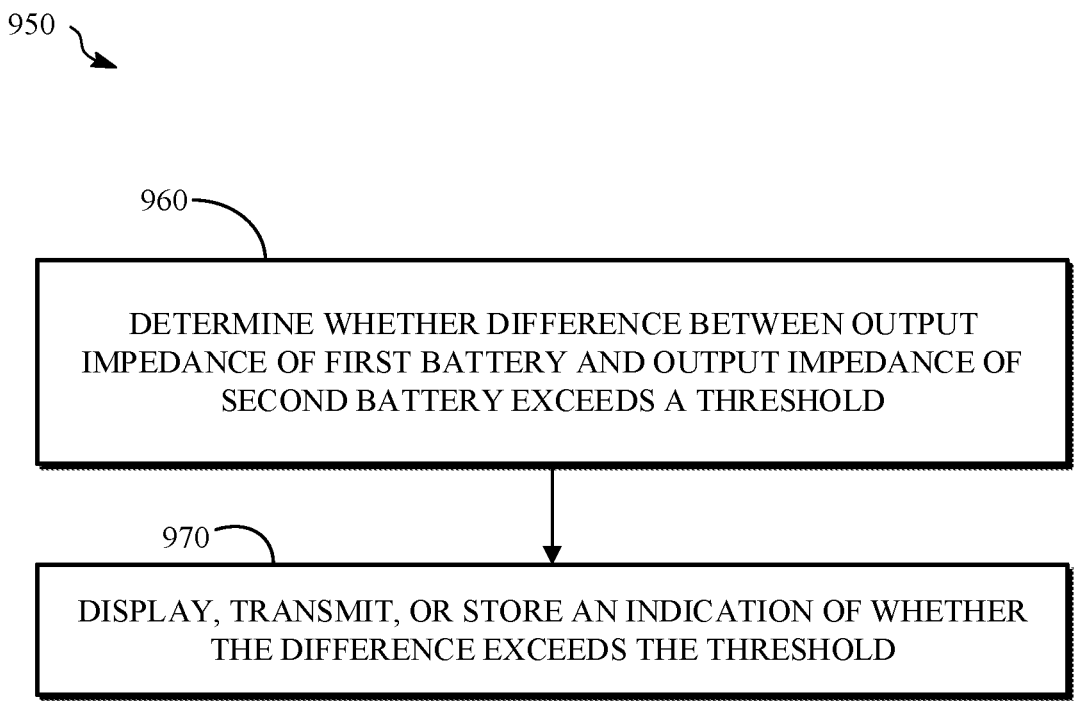
FIG. 9B is a flowchart of an example of a process for checking a condition of a battery to test the battery.

FIG. 9B is a flowchart of an example of a process 950 for checking a condition of a battery to test the battery. The process 950 includes determining 960 whether a difference between an output impedance of the first battery under test and an output impedance of the second battery under test exceeds a threshold, and displaying, transmitting, or storing 970 an indication of whether the difference exceeds the threshold. The process 900 may be implemented by the differential battery tester 600 of FIG. 6. Alternatively, the process 900 may be implemented by the differential battery tester 100 of FIG. 1 with the reference voltage source 140 implemented as the reference voltage source 400 of FIG. 4.

In some implementations, the battery is a first battery under test and the reference voltage source includes a second battery under test (e.g., the second battery 620 or the reference battery 430). Connectors (e.g., the third connector 440 and the fourth connector 442) are configured to connect the positive terminal of the reference voltage source to a positive terminal of the second battery under test and to connect the negative terminal of the reference voltage source to a negative terminal of the second battery under test.

The process 950 includes determining 960 whether a difference between an output impedance of the first battery under test and an output impedance of the second battery under test exceeds a threshold. In some implementations, the difference between an output impedance of the first battery under test and an output impedance of the second battery under test may be proportional to a measured voltage difference between the two batteries when two equal load impedances are applied to the two batteries respectively. For example, the measured voltage difference between the two batteries may be compared to a corresponding threshold to determine 960 whether a difference between an output impedance of the first battery under test and an output impedance of the second battery under test exceeds a threshold.

The process 950 includes displaying, transmitting, or storing 970 an indication of whether the difference exceeds the threshold. In an example, the indication includes a "pass" or a "fail" message for one of the batteries. The indication may be displayed 970 in the user interface 180 of FIG. 1. The indication may be stored 970 in memory by the processor 170 of FIG. 1. The indication may be transmitted 970 by the processor 170 (e.g., via network communications signals) to an external device (e.g., a diagnostic test bench, a tablet, a server) for display or storage.

Figure 10:
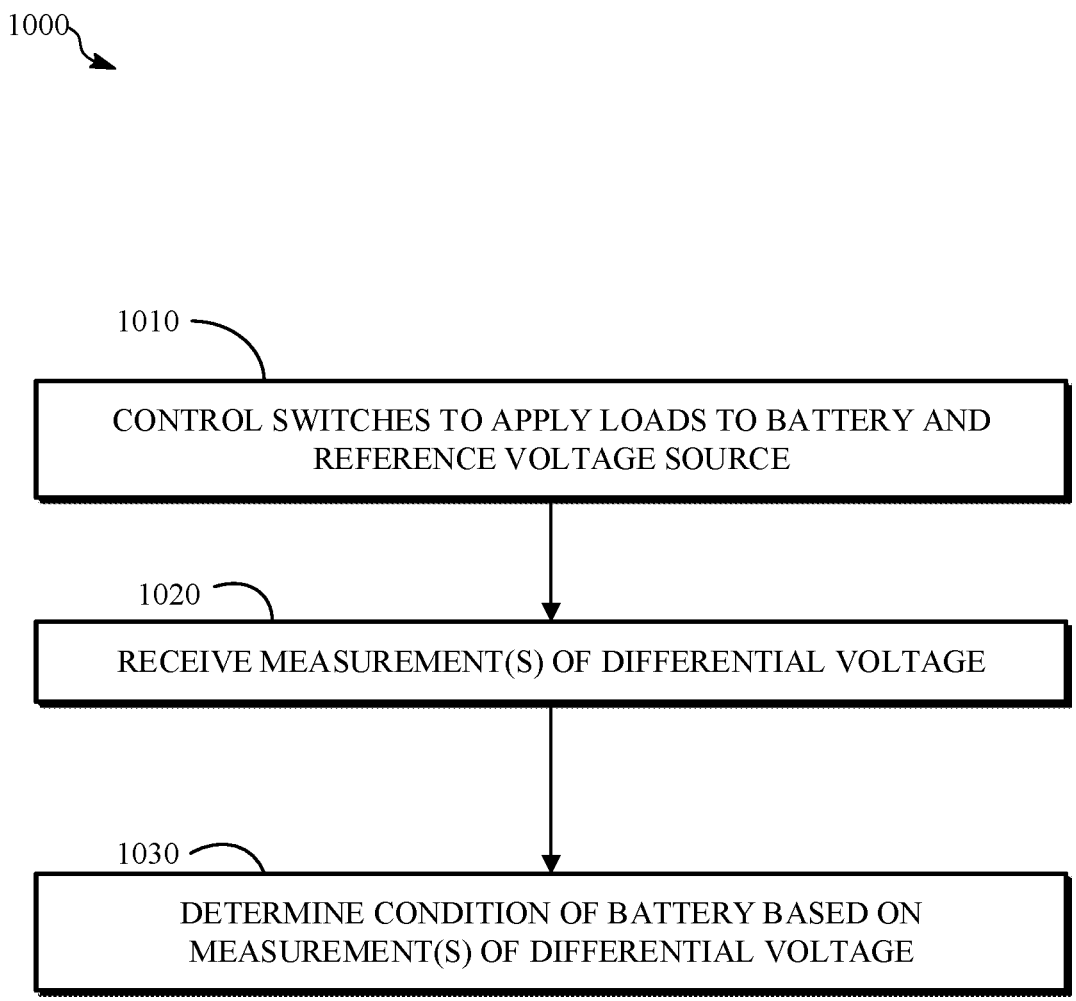
FIG. 10 is a flowchart of an example of a process for determining a condition of a battery based on differential voltage measurements.

FIG. 10 is a flowchart of an example of a process 1000 for determining a condition of a battery based on differential voltage measurements. The process 1000 includes controlling 1010 switches to apply loads to a battery and a reference voltage source, receiving 1020 one or more measurements of differential voltage between the battery and the reference voltage source, and determining 1030 a condition of the battery based on the one or more measurements of differential voltage. The process 1000 may be implemented by the differential battery tester 100 of FIG. 1.

The process 1000 includes controlling 1010 switches to selectively apply a first load impedance to the battery and a second load impedance to the reference voltage source. For example, in the differential battery tester 100, the first switch 160 and the second switch 162 are controlled 1010 to selectively apply the first load impedance 150 to the battery (e.g., the battery under test 110) and the second load impedance 152 to the reference voltage source 140. The switches may be controlled 1010 synchronously by driving a voltage on a common gate node (e.g., similar to the control line 654).

The process 1000 includes receiving 1020 one or more measurements of differential voltage between the battery and the reference voltage source. For example, in the differential battery tester 100, one or more measurements of voltage between the first input node 132 and the second input node 134 are received 1020 while the loads are applied to the battery and the reference voltage source. The one or more measurements of differential voltage may be received 1020 from a voltmeter (e.g., the voltmeter 130) via an input port (e.g., a port including an analog to digital converter, a serial port, or a system bus).

The process 1000 includes determining 1030 a condition (e.g., an output impedance, an output conductance, a state of charge, and/or a state of health) of the battery based on the one or more measurements of differential voltage. For example, in the differential battery tester 100, a condition of the battery (e.g., the battery under test 110) is determined 1030 based on the one or more measurements of voltage between the first input node 132 and the second input node 134. A condition of the battery may be determined 1030 as described in relation to operation 740 of FIG. 7. The process 900 of FIG. 9A may be implemented to determine 1030 a condition of the battery. A condition of the battery may be determined 740 by the processor 170 of FIG. 1.

Figure 11:
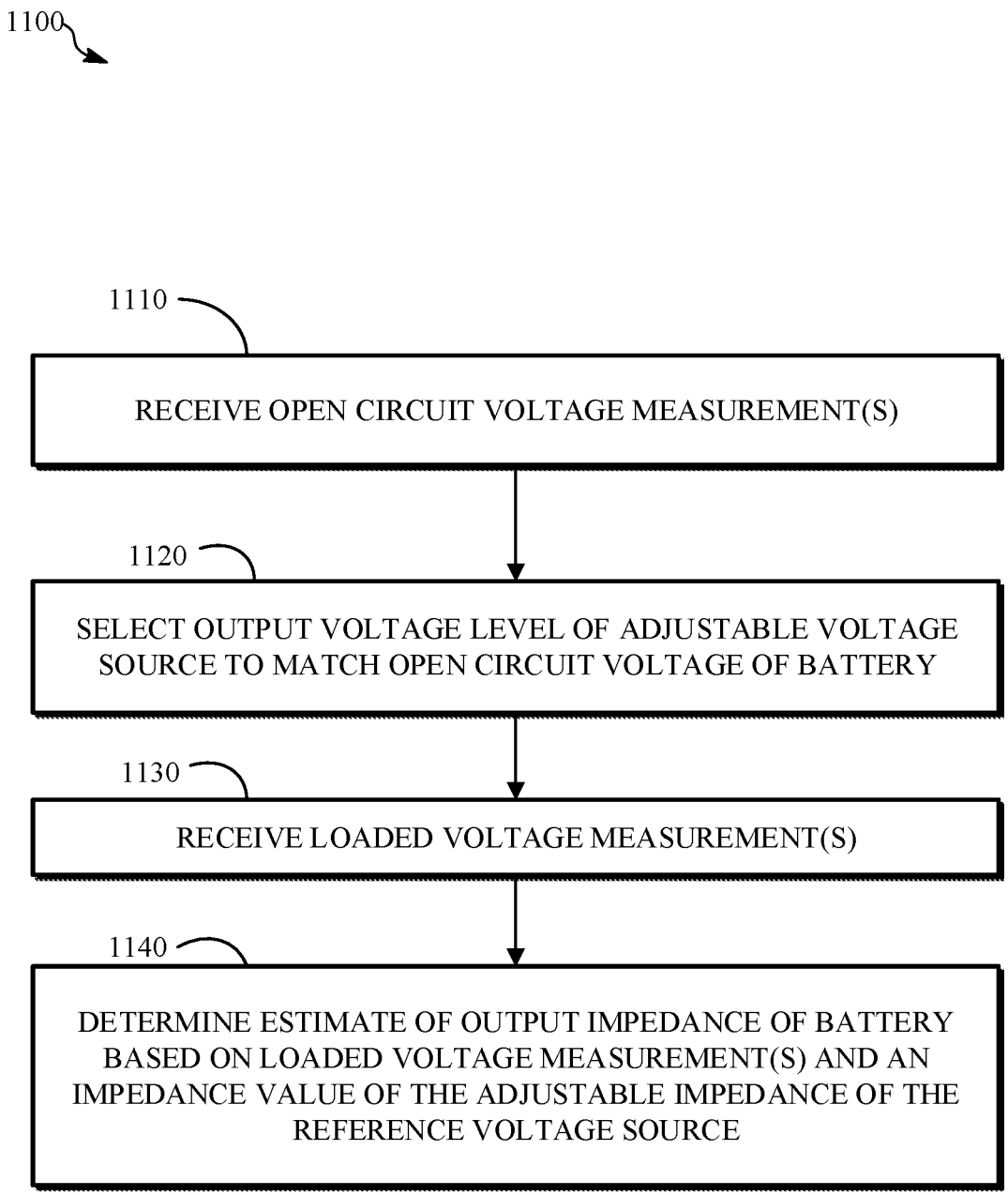
FIG. 11 is a flowchart of an example of a process for testing a battery using a differential battery tester.

FIG. 11 is a flowchart of an example of a process 1100 for testing a battery using a differential battery tester. The process 1100 includes receiving 1110 one or more open circuit voltage measurements while a first switch and a second switch are open, selecting 1120 an output voltage level of an adjustable voltage source to match the open circuit voltage of the battery, receiving 1130 one or more loaded voltage measurements while the first switch and the second switch are closed, and determining 1140 an estimate of an output impedance of the battery based on the one or more loaded voltage measurements and an impedance value of the adjustable impedance. The process 1100 may be implemented using the differential battery tester 100 of FIG. 1.

The process 1100 includes receiving 1110 one or more open circuit voltage measurements while the first switch and the second switch are open. For example, in the differential battery tester 100, one or more open circuit voltage measurements are received 1110 while the first switch 160 and the second switch 162 are open. In this manner the respective loads (e.g., the first load impedance 150 and the second load impedance 152) are not applied to the battery and the reference voltage source respectively while the open circuit voltage is measured.

The process 1100 includes selecting 1120 an output voltage level of the adjustable voltage source to match the open circuit voltage of the battery. For example, in the differential battery tester 100 using the reference voltage source 200 of FIG. 2, an output voltage level of the adjustable voltage source 210 is selected 1120 to match the open circuit voltage of the battery (e.g., the battery under test 110). The output voltage level may be selected 1120 using a PWM control signal input through the voltage control port 352 of FIG. 3. The voltage level of the reference voltage source may be selected 1120 by iteratively adjusted the voltage level until the measured differential voltage is at or near zero so that the open circuit voltage of the reference voltage source is configured to match the open circuit voltage of the battery.

The process 1100 includes receiving 1130 one or more loaded voltage measurements while the first switch and the second switch are closed. For example, in the differential battery tester 100, one or more loaded voltage measurements are received 1130 while the first switch 160 and the second switch 162 are closed. In this manner the respective loads (e.g., the first load impedance 150 and the second load impedance 152) are applied to the battery and the reference voltage source respectively while the loaded voltage is measured.

The process 1100 includes determining 1140 an estimate of an output impedance of the battery based on the one or more loaded voltage measurements and an impedance value of the adjustable impedance. In the differential battery tester 100 using the reference voltage source 200 of FIG. 2, an estimate of an output impedance of the battery (e.g., the battery under test 110) is determined 1140 based on the one or more loaded voltage measurements and an impedance value of the adjustable impedance 220. An estimate of an output impedance of the battery (e.g., the battery under test 110) may be determined 1140 based on the one or more loaded voltage measurements, the open circuit voltage of the battery, the selected 1120 voltage level of the adjustable voltage source, the impedance value of the adjustable impedance, the known impedance of the first load impedance, and the known impedance of the second load impedance. In some implementations, a plurality of the one or more loaded voltage measurements are combined (e.g., averaged) to determine an estimate of the loaded voltage, from which the estimate of the output impedance of the battery may be determined 1140. In some implementations, determining 1140 an estimate of an output impedance of the battery includes dividing the loaded voltage by an estimate of current through the first impedance and adding the impedance value of the adjustable impedance. For example, assuming the first load impedance and the second load impedance are equal and much larger than the output impedance of the battery and the impedance value of the adjustable impedance, and that the selected 1120 voltage level of the adjustable voltage source is equal to the open circuit voltage of the battery, then the current through the battery and the current through the reference voltage source are both approximated as $I=V\_bat/Z\_1=V\_ref/Z\_2$, where $V\_bat$ is the open circuit voltage of the battery, $Z\_1$ is the first load impedance, $V\_ref$ is the selected 1120 voltage level of the adjustable voltage source, and $Z\_2$ is the second load impedance. In this case, the estimate of the output impedance of the battery is determined 1140 as $R\_bat=(V\_diff/I)+R\_ref$, where $V\_diff$ is the loaded voltage and $R\_ref$ is the impedance value of the adjustable impedance. The condition of the battery may be determined 740 by the processor 170 of FIG. 1.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A circuit for battery testing, comprising:
    a first connector configured to electrically couple to a positive terminal of a battery;
    a second connector configured to electrically couple to a negative terminal of the battery;
    a reference voltage source with a positive reference terminal and a negative reference terminal;
    a conductor connecting the second connector to the negative reference terminal;
    a voltmeter configured to measure voltage between a first input node and a second input node, wherein the first input node is connected to the first connector and wherein the second input node is connected to the positive reference terminal;
    a first switch in series with a first load impedance connected between the first connection and the second connection;
    a second switch in series with a second load impedance connected between the positive reference terminal and the negative reference terminal; and
    a processor connected to the voltmeter and configured to:
        control the first switch and the second switch to selectively apply the first load impedance to the battery and the second load impedance to the reference voltage source,
        receive one or more measurements of voltage between the first input node and the second input node, and
        determine a condition of the battery based on the one or more measurements of voltage between the first input node and the second input node.

2. The circuit of claim 1, wherein the reference voltage source comprises:
    a third connector, connected to the positive reference terminal, and configured to electrically couple to a positive terminal of a reference battery; and a fourth connector, connected to the negative reference terminal, and configured to electrically couple to a negative terminal of a reference battery.

3. The circuit of claim 1, wherein the reference voltage source comprises circuitry configured to simulate a battery in a good condition.

4. The circuit of claim 1, wherein the reference voltage source comprises:
an adjustable voltage source configured to output a voltage level selected by the processor; and
an adjustable impedance configured to be selected based on control signals from the processor.

5. The circuit of claim 4, wherein the adjustable voltage source comprises:
a resistor-capacitor network configured to filter a pulse width modulated voltage control signal from the processor to control an output voltage of the adjustable voltage source.

6. The circuit of claim 4, wherein the adjustable impedance comprises a potentiometer.

7. The circuit of claim 4, wherein the processor is configured to:
receive one or more open circuit voltage measurements while the first switch and the second switch are open;
select an output voltage level of the adjustable voltage source to match an open circuit voltage of the battery;
receive one or more loaded voltage measurements while the first switch and the second switch are closed; and
determine an estimate of an output impedance of the battery based on the one or more loaded voltage measurements and an impedance value of the adjustable impedance.

8. The circuit of claim 1, wherein the voltmeter comprises an operational amplifier configured to amplify voltage between the first input node and the second input node.

9. A method for battery testing, comprising:
applying a first load impedance to a battery;
applying a second load impedance to a reference voltage source;
measuring a voltage between a positive terminal of the battery and a positive terminal of the reference voltage source, wherein a negative terminal of the battery is connected via a conductor to a negative terminal of the reference voltage source; and
determining a condition of the battery based on the measured voltage.

10. The method of claim 9, comprising:
calibrating the reference voltage source based on an open circuit voltage between the positive terminal of the battery and the positive terminal of the reference voltage source that is measured while a current through the first load impedance is zero and a current through the second load impedance is zero.

11. The method of claim 10, wherein calibrating the reference voltage source comprises adjusting an output voltage of the reference voltage source until the open circuit voltage becomes zero.

12. The method of claim 9, wherein determining the condition of the battery based on the measured voltage comprises:
determining an output impedance of the battery based on the measured voltage and an output impedance of the reference voltage source.

13. The method of claim 12, wherein determining the condition of the battery based on the measured voltage comprises:
determining a state of health of the battery based on the output impedance of the battery.

14. The method of claim 9, wherein the first load impedance is equal to the second load impedance and wherein determining the condition of the battery based on the measured voltage comprises:
determining an output impedance of the battery by dividing the measured voltage by an estimate of current through the first load impedance and adding an output impedance of the reference voltage source.

15. The method of claim 9, wherein applying the first load impedance to the battery comprises:
closing a first switch connected in series with the first load impedance between the positive terminal of the battery and the negative terminal of the battery.

16. The method of claim 15, wherein applying the second load impedance to the reference voltage source comprises:
closing a second switch connected in series with the first load impedance between the positive terminal of the reference voltage source and the negative terminal of the reference voltage source; and
wherein the first switch and the second switch are controlled by a common control signal.

17. The method of claim 9, comprising:
adjusting an output impedance of the reference voltage source.

18. The method of claim 9, wherein the battery is a first battery under test and wherein the reference voltage source includes a second battery under test and connectors configured to connect the positive terminal of the reference voltage source to a positive terminal of the second battery under test and to connect the negative terminal of the reference voltage source to a negative terminal of the second battery under test, and further comprising:
determining whether a difference between an output impedance of the first battery under test and an output impedance of the second battery under test exceeds a threshold; and
displaying, transmitting, or storing an indication of whether the difference exceeds the threshold.

19. An apparatus for battery testing, comprising:
a first connector configured to electrically couple to a positive terminal of a battery;
a second connector configured to electrically couple to a negative terminal of the battery;
a reference voltage source with a positive reference terminal and a negative reference terminal;
a voltmeter configured to measure voltage between a first input node and a second input node, wherein the first input node is connected to the first connector and wherein the second input node is connected to the positive reference terminal; and
a processor connected to the voltmeter and configured to:
selectively apply a first load impedance to the battery and a second load impedance to the reference voltage source,
receive one or more measurements of voltage between the first input node and the second input node, and
determine a condition of the battery based on the one or more measurements of voltage between the first input node and the second input node.

20. The apparatus of claim 19, wherein the reference voltage source comprises:
an adjustable voltage source configured to output a voltage level selected by the processor; and an adjustable impedance configured to be selected based on control signals from the processor.

* * * * *